United States Patent [19]

Kadowaki et al.

[11] 4,297,730

[45] Oct. 27, 1981

[54] MAGNETIC RECORDING AND REPRODUCING DEVICE

[75] Inventors: Hidetaka Kadowaki; Akira Inomata; Kiyoshi Yanagida; Tsunao Hasegawa; Satoshi Ishii; Yasushi Ohtake, all of Tokorozawa, Japan

[73] Assignee: Pioneer Electronic Corporation, Tokyo, Japan

[21] Appl. No.: 174,389

[22] PCT Filed: Mar. 1, 1979

[86] PCT No.: PCT/JP79/00051

§ 371 Date: Nov. 1, 1979

§ 102(e) Date: Oct. 29, 1979

[87] PCT Pub. No.: WO79/00715

PCT Pub. Date: Oct. 4, 1979

[51] Int. Cl.³ .................. G11B 5/47; G11B 15/12

[52] U.S. Cl. ........................ 360/66; 360/62; 360/65

[58] Field of Search ............... 360/65, 62, 66

[56] References Cited

FOREIGN PATENT DOCUMENTS 50-98309 2/1975 Japan .
50-31712 9/1975 Japan .
51-23119 2/1976 Japan .
51-107809 9/1976 Japan .

Primary Examiner—Vincent P. Canney
Attorney, Agent, or Firm—Sughrue, Mion, Zinn, Macpeak and Seas

[57] ABSTRACT

This invention relates to a magnetic recording and reproducing device in which automatic settings of optimum recording bias current, optimum recording level and optimum recording equalization characteristic are successively accomplished in this order. The settings of the optimum recording conditions are achieved with high accuracy within short period of time by a computer control using a microprocessor.

11 Claims, 36 Drawing Figures

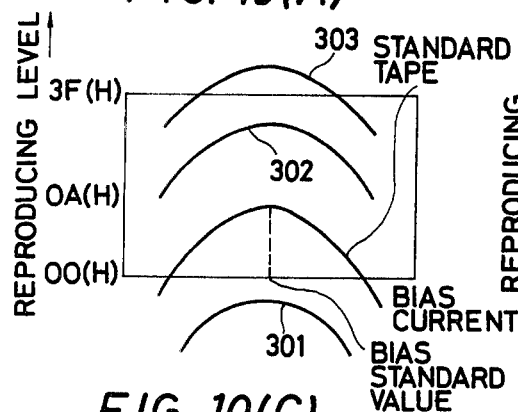
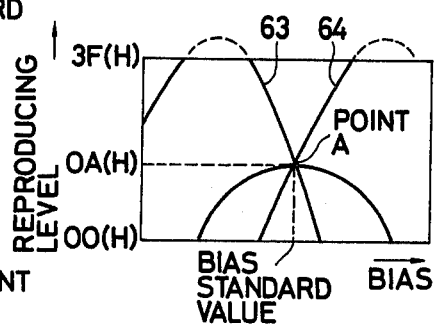
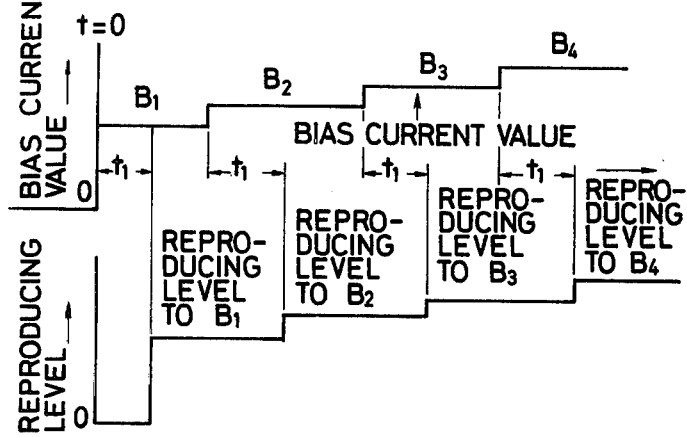
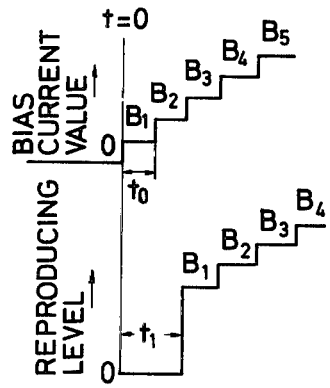
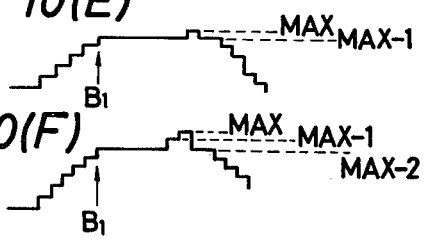
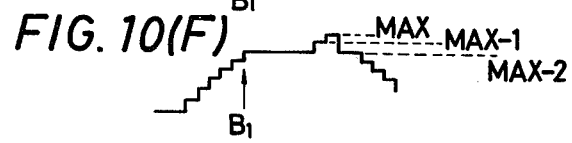

MAGNETIC RECORDING AND REPRODUCING DEVICE

FIELD OF THE INVENTION

This invention relates to magnetic recording and reproducing devices, and more particularly to a magnetic recording and reproducing device in which optimum recording bias current, optimum recording level and optimum recording equalization characteristic are automatically set irrespective of the characteristic of a magnetic tape to be used.

BACKGROUND OF THE INVENTION

Magnetic tapes are classified into L.H. (low noise, high output) tapes, chromium tapes and ferrite chromium tapes, etc. In general, tape recorders are adjusted in accordance with a standard tape among various kind of tapes. However, in tape recorders whose recording conditions are fixed, the recording and reproducing characteristics are greatly fluctuated, because even the magnetic tapes of the same kind are of great difference in characteristics. In each magnetic tape, the frequency characteristic, distortion and M.O.L. (high frequency saturation level) are fluctuated by the variation of the bias current. It is well known in the art that, in general, the high frequency characteristic is upgraded with small bias current whereas it is degraded with large bias current. Furthermore, it is also known in the art that, with large bias current, the distortion factor is low, but the high frequency saturation level is decreased and the dynamic range is lowered, i.e. the high frequency characteristic and the distortion factor are contradictorily affected by the increase or decrease of the bias current. Thus, it can be understood that any magnetic tape has the optimum bias current with which the distortion factor is in balance with the high frequency dynamic range. Accordingly, if the tape recorder is set for this optimum bias current and an equalization characteristic causing the frequency characteristic to be flat is provided, then the characteristic of each magnetic tape can be maximally utilized.

SUMMARY OF THE INVENTION

Accordingly, an object of the invention is to provide a magnetic recording and reproducing device in which the optimum values of the recording conditions thereof, i.e. recording bias, recording level and recording equalization characteristic are automatically detected.

In a method according to first embodiment of the invention, a recording bias current is initially varied at arbitrary time intervals, and reference recording/reproducing signals corresponding to the recording bias current thus varied are digitally stored and operated, to set the optimum recording bias current. In this operation, at least two optimum recording bias currents are obtained and are then subjected to additive average to obtain a finally optimum recording bias current. Next, a recording level is varied at arbitrary time intervals, and reference recording/reproducing signals corresponding to the recording level thus varied are compared with a reference level, to set an optimum recording level. In this operation, at least two optimum recording levels are obtained and are then subjected to additive average in digital mode, to obtain a finally optimum level of recording current. A recording equalization characteristic is varied at arbitrary time intervals, and high frequency band reference recording/reproducing signals corresponding to the recording equalization characteristic thus varied are compared with a reference level, to obtain an optimum recording equalization characteristic. In this operation also, at least two optimum recording equalization characteristic data are obtained and are then subjected to additive average in digital mode, to obtain a finally optimum recording equalization characteristic.

In a method according to a second embodiment of the invention, a recording bias is set for a standard bias according to the kind of a magnetic tape to be used, and with respect to the standard recording bias, the recording level, the recording level of first recording signal (400 Hz) is set to the optimum level in accordance with a suitable method. Then, coarse adjustment is carried out so that the reproducing level becomes a standard reproducing level by successively changing a recording compensation value with respect to second recording signal (10 KHz). The second recording signal is stored with the aid of the recording compensation value, and the reproducing signal level corresponding thereto is compared with a standard level a predetermined number of times at arbitrary time intervals, so as to determine the number of times (N) of comparison with which the reproducing signal level becomes higher than the reference level. In the case when the number of times (N) is larger than a predetermined number $N_1$ ($N > N_1$), then the recording compensation value is decreased by a predetermined value, and the comparison is carried out again. If the number of times is smaller than a predetermined number $N_2$ ($N_1 > N_2$), then the recording compensation value is increased by a predetermined value, and the comparison is carried out again. The recording compensation value obtained when the number of times obtained as a result of these comparison operations is between the values $N_1$ and $N_2$ is determined as the optimum recording compensation value. Furthermore, if the recording compensation value is the upper limit of a predetermined range, then the recording bias is decreased by a predetermined value, and the above-described operation is carried out again.

BRIEF DESCRIPTION OF THE DRAWINGS

FIG. 9 through FIG. 11 are waveform diagrams for a description of the operation of the second embodiment;

DETAILED DESCRIPTION OF THE PREFERRED EMBODIMENTS

Figure 1:
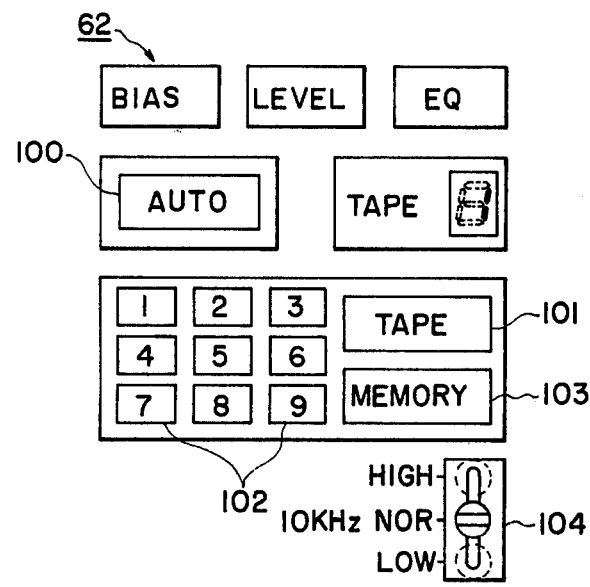
FIG. 1 is an explanatory diagram showing one example of a keyboard employed in a magnetic recording and reproducing device according to this invention.
Figure 4:
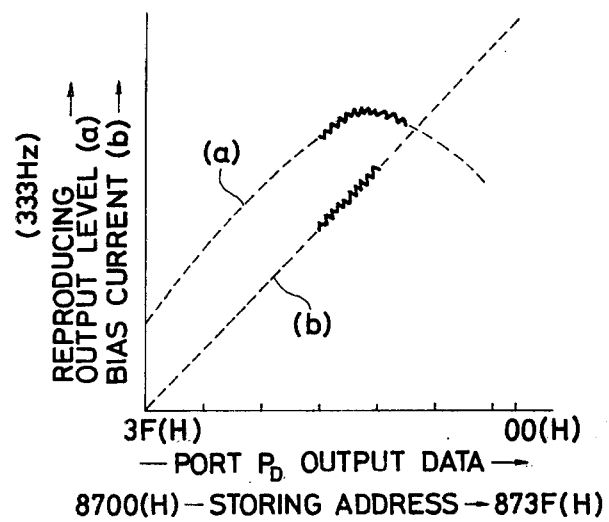
FIGS. 4 through 6 are characteristic diagrams for a description of the operation of the first embodiment.

This invention will be described with reference to the accompanying drawings. FIG. 1 is a schematic diagram showing a keyboard. Upon depression of an "AUTO" key 100, a magnetic recording and reproducing device is automatically controlled by a central processing unit 35 (hereinafter referred to as "a CPU 35") shown in FIG. 3, and the optimum adjustment operation of a recording bias, a recording level and a recording equalization characteristic (hereinafter referred to as "an EQ characteristic"). When a "MEMORY" key 103 is depressed and then one of digit keys 102 is depressed, the optimum data of a recording bias, a recording level and an EQ characteristic which are automatically set for a magnetic tape to be used are stored in a random access memory 36 (hereinafter referred to as "a RAM 36"). When a "TAPE" key is depressed and then the same digit key is depressed, the data are read out of the RAM 36. In the case where the "TAPE" key 101 is depressed but no digit key 102 is depressed, a recording bias, a recording level and an EQ characteristic in standard state can be obtained. The term "standard state" is intended to mean the state that a bias current control signal, a recording level control signal and an EQ control signal are controlled by a signal at a mid step of its variable range. In other words, in the standard state, adjustment is made for a standard tape. The standard state corresponds to the fixed bias, recording level and EQ state of a tape recorder having no automatic adjustment device. "BIAS", "LEVEL" and "EQ" lamps are provided as display lamps, and these lamps are turned on and off in response to the operation of the device. The keyboard is further provided with a "TAPE" indicator employing a seven-segment indicating element with which kinds of tapes are selectively indicated by the operator. More specifically, in the case of the standard state, one of the standard tape, chromium tape and ferrite chromium tape is selectively indicated by the operator. For instance, in the case of the standard tape, a symbol "—" is indicated, and in the cases of the chromium tape and the ferrite chromium tape, symbols "=" and "≡" are indicated, respectively. Furthermore, when set data (corresponding to digital control signal) automatically adjusted are stored in the RAM 34 or are read out of the latter, a tape number (1-9) corresponding to the RAM is indicated.

In accordance with Flow Chart 1 shown in FIG. 2, first embodiment of the device according to the invention will be specifically described with reference to FIGS. 3 through 6.

Figure 3:
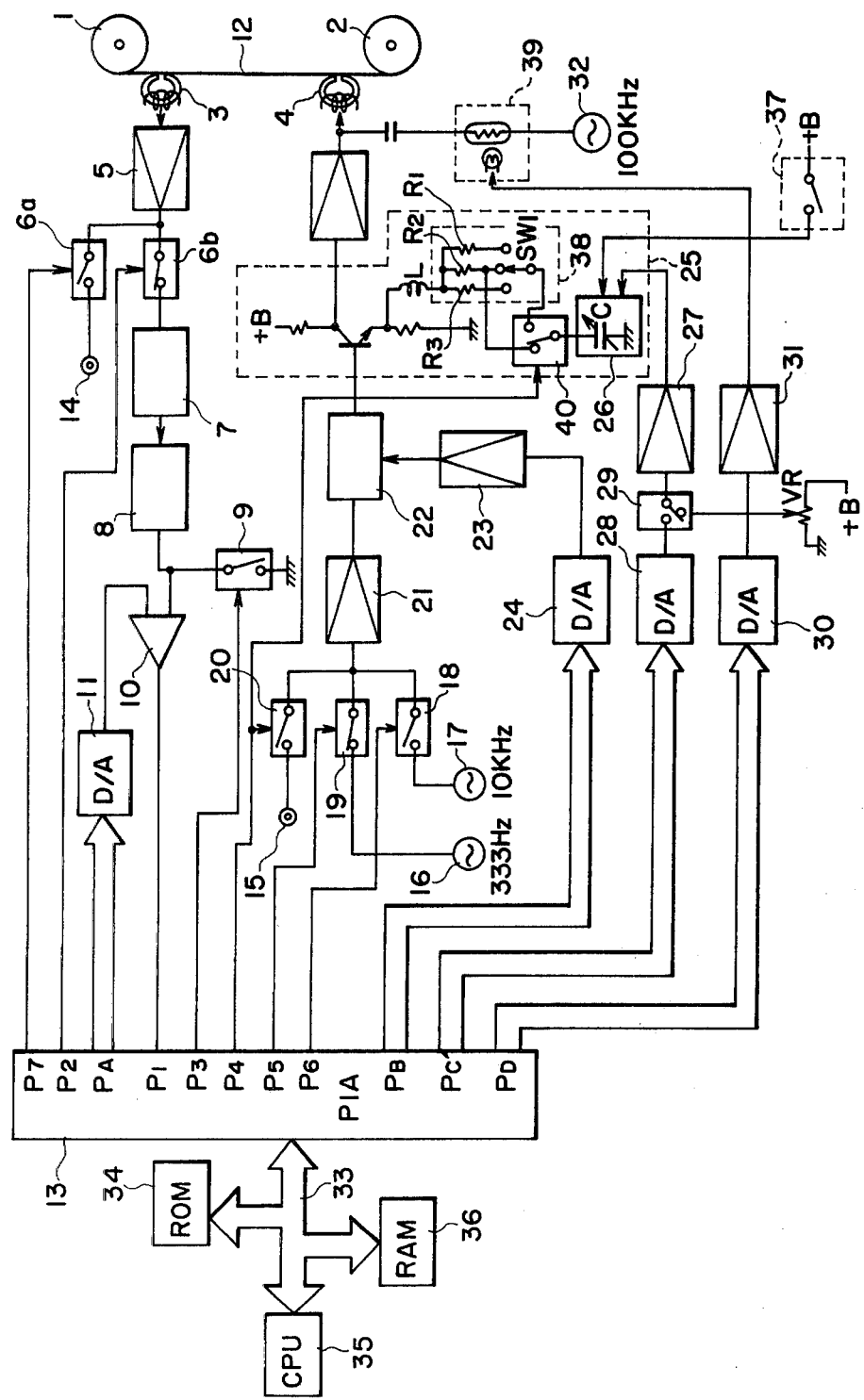
FIG. 3 is a block diagram showing the first embodiment of the invention.
Figure 5:
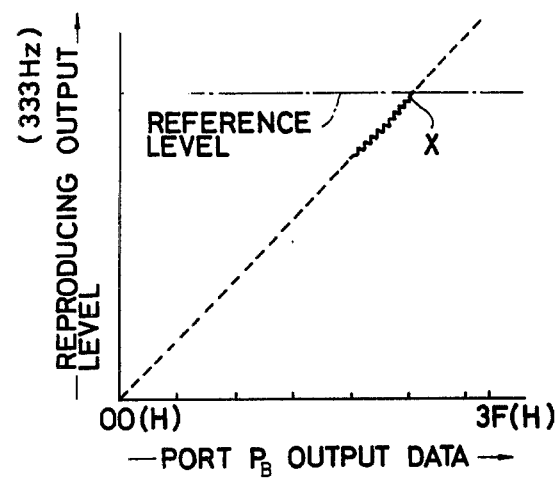
Figure 6:
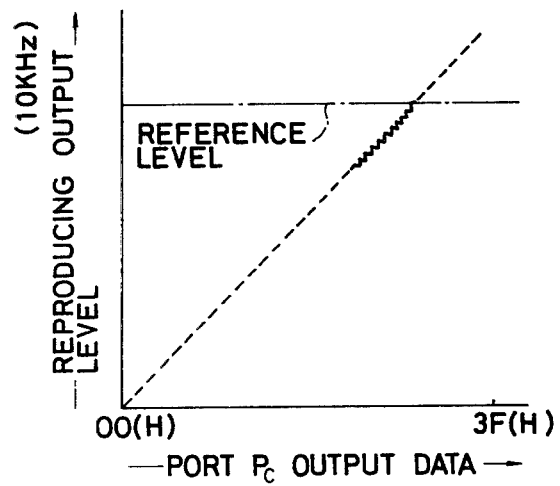
Figure 7:
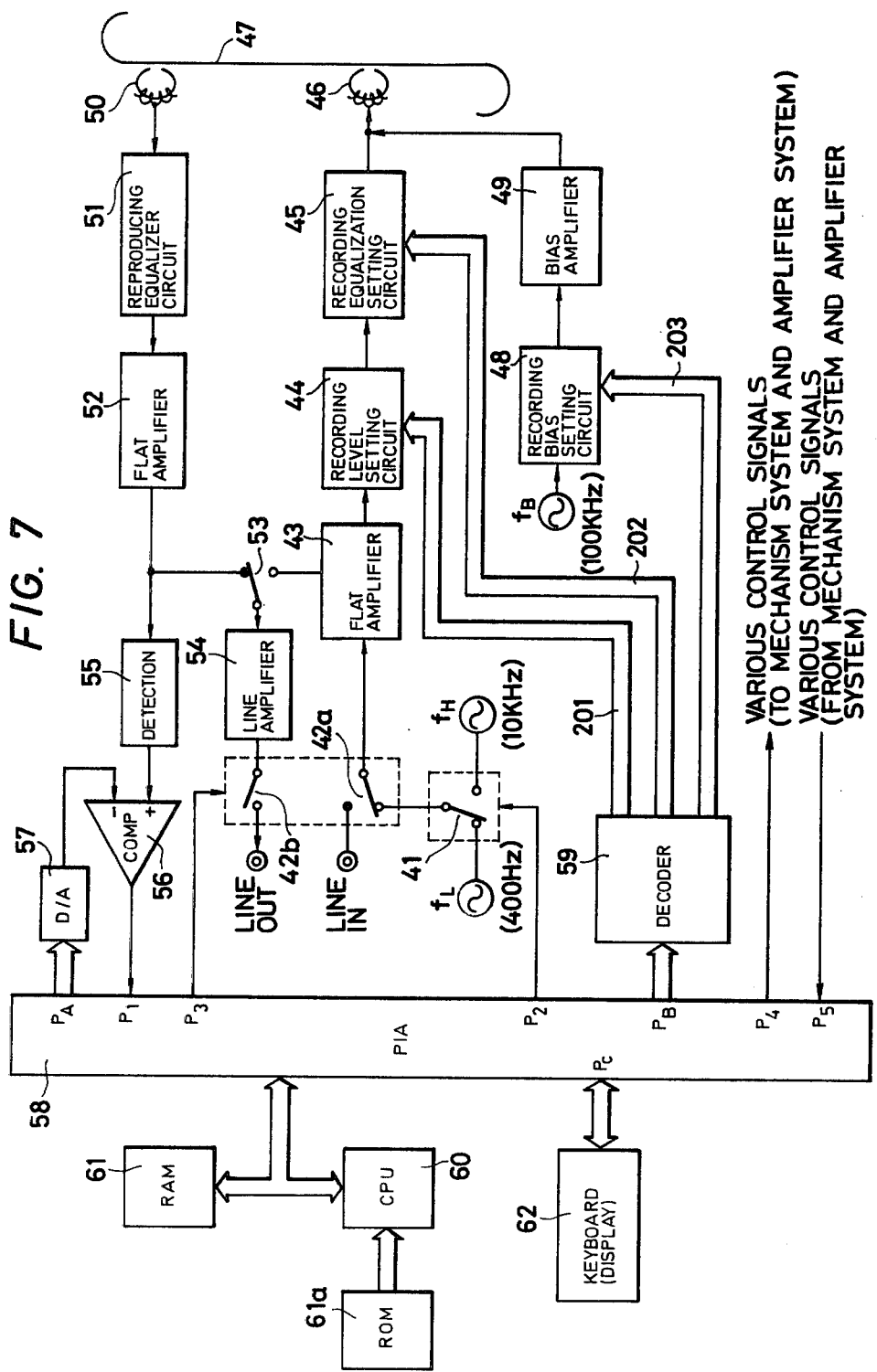
FIG. 7 is a block diagram showing second embodiment of the invention.
Figure 8:
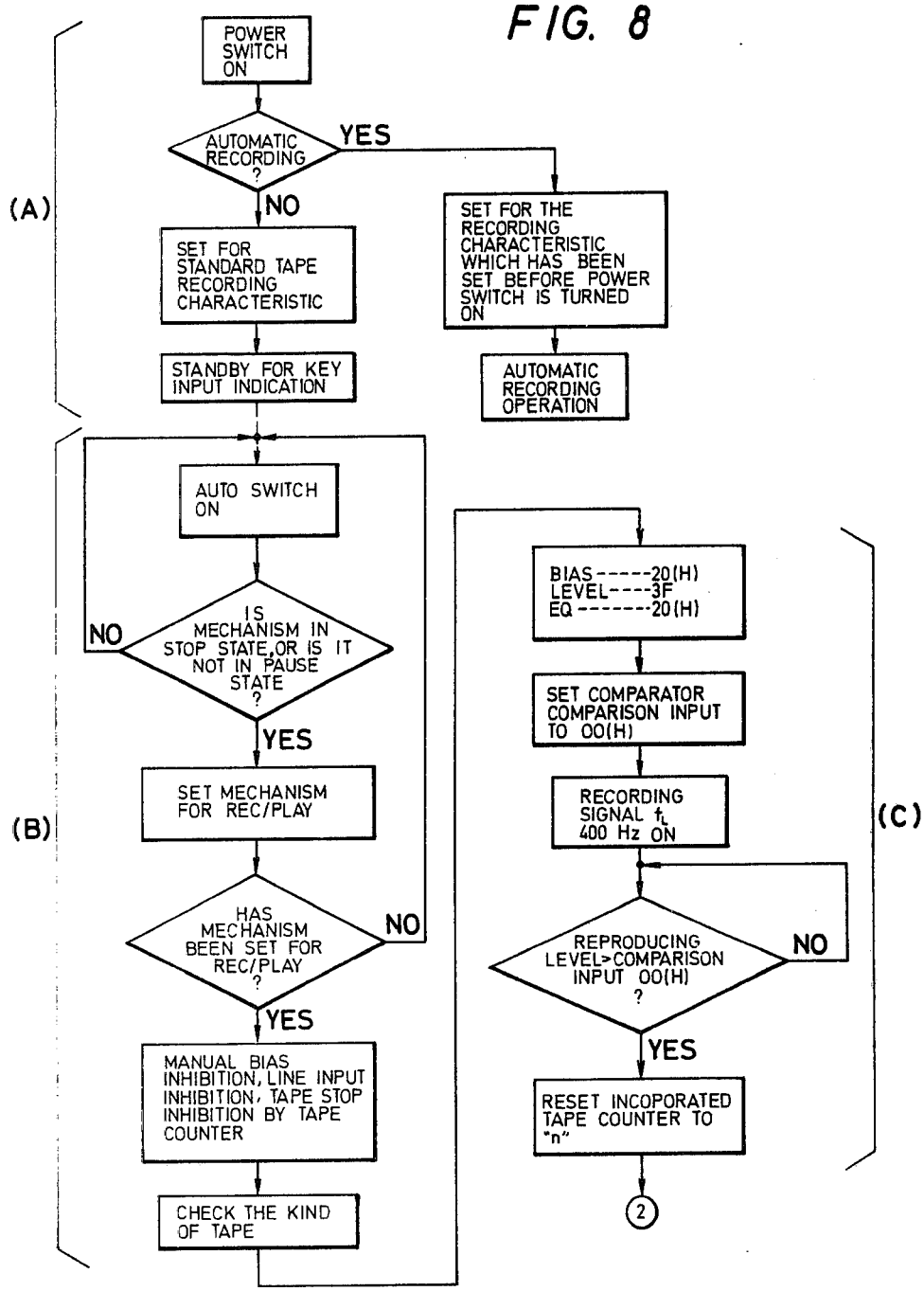
FIG. 8 is a flow chart showing the flow of operation of the second embodiment.
Figure 8:
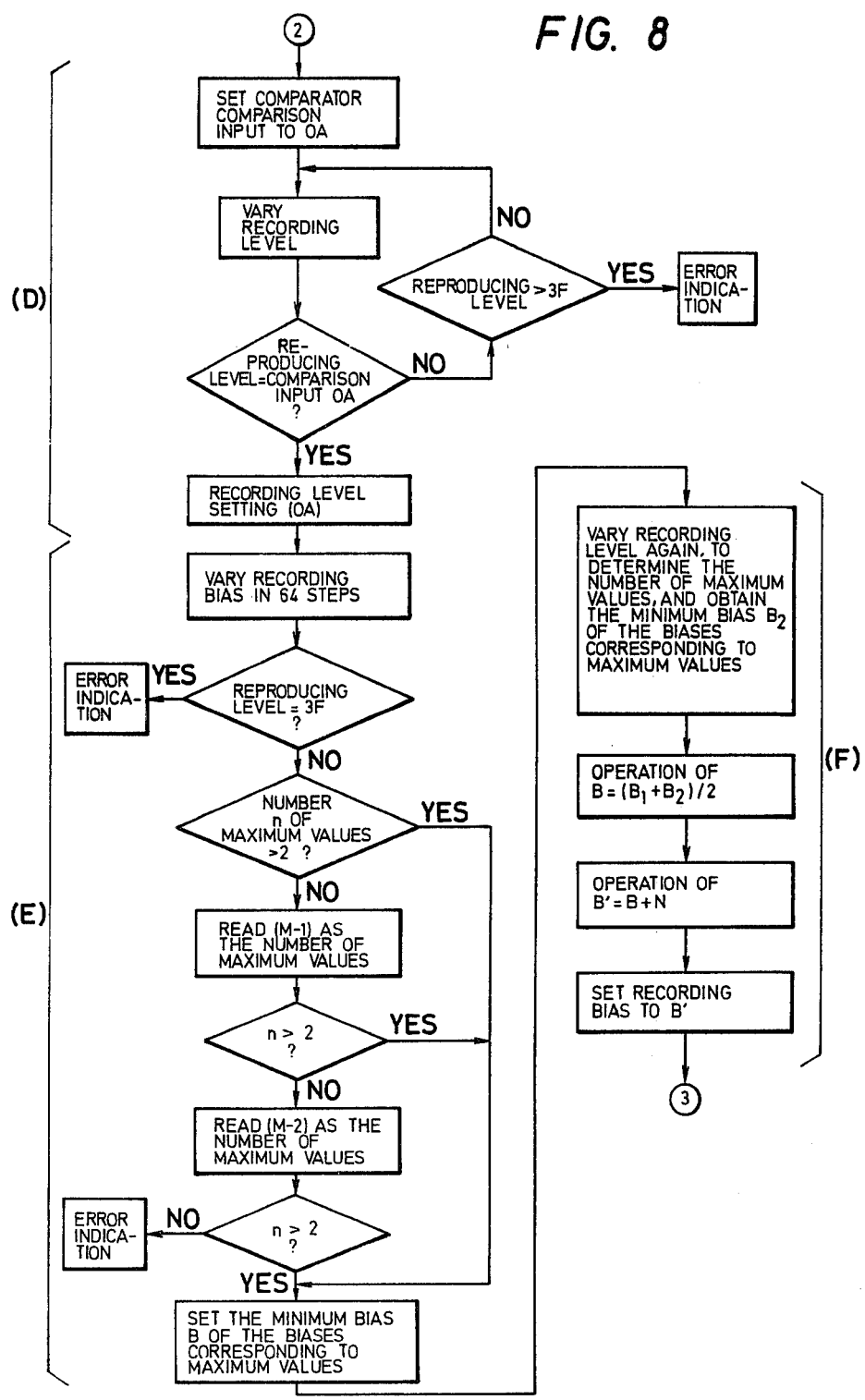
Figure 8:
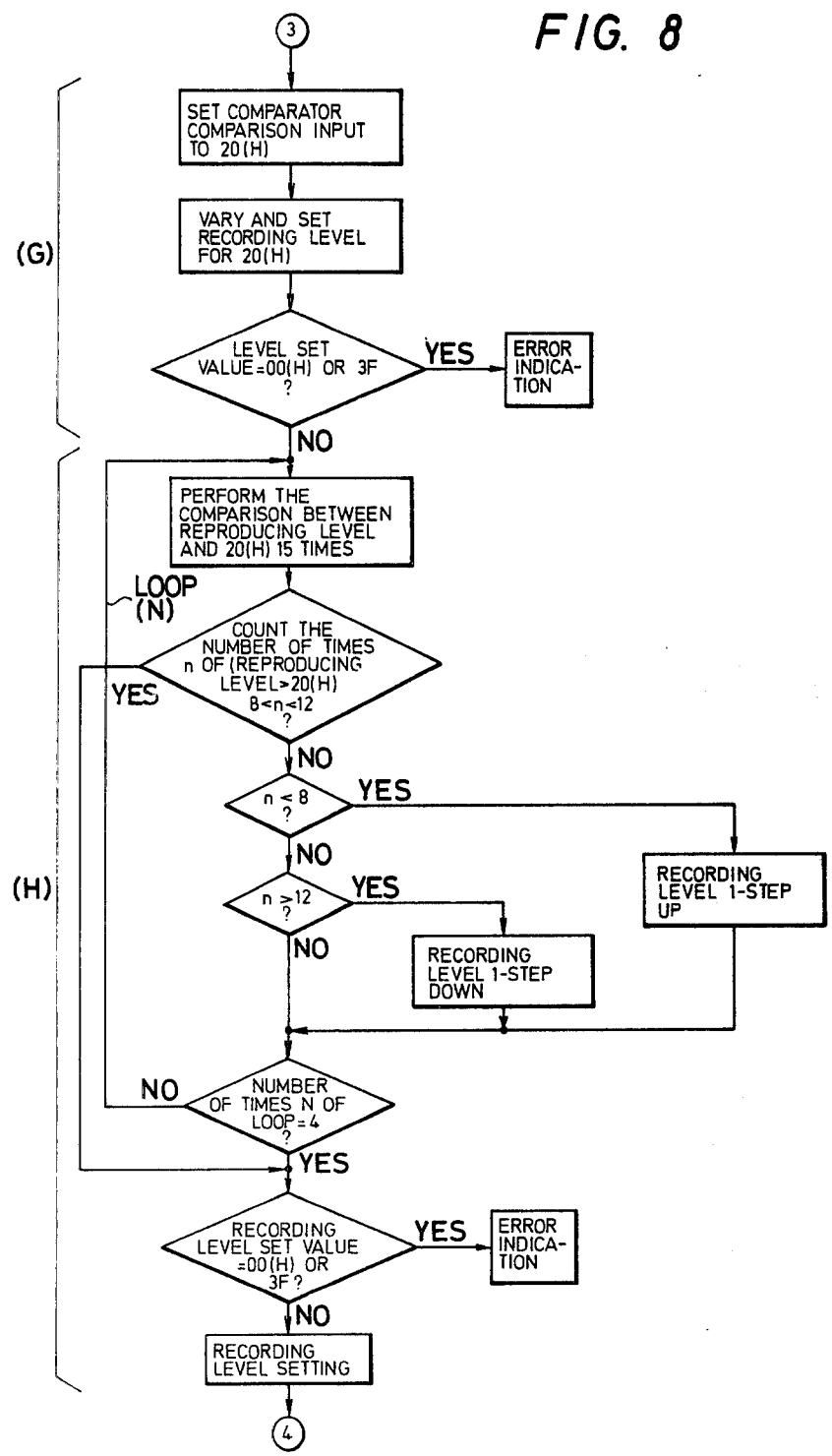
Figure 8:
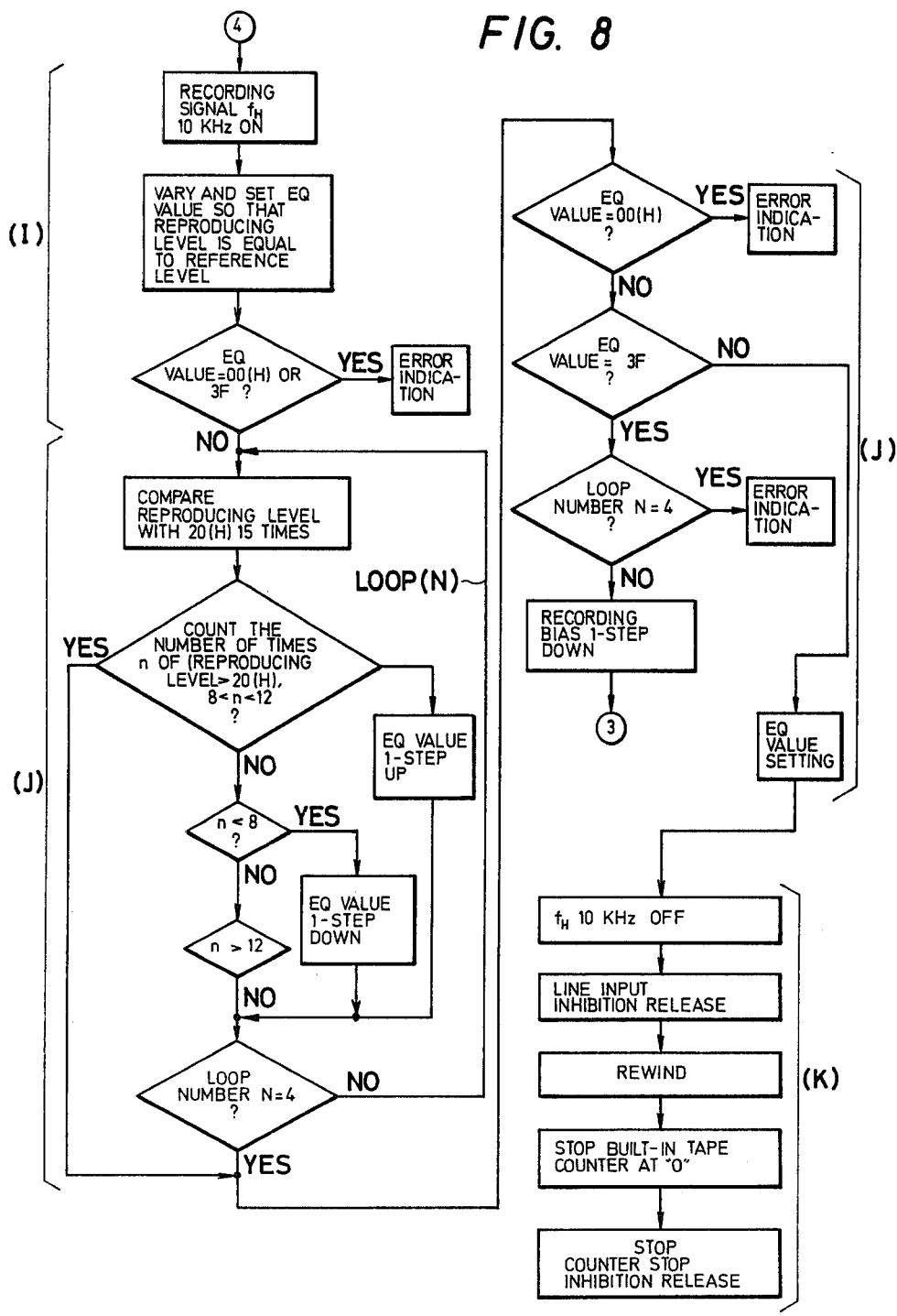

As shown in FIG. 3, a stored program system microprocessor is incorporated in the magnetic recording and reproducing device according to the invention. The contents of a read only memory 34 (hereinafter referred to as "a ROM 34") into which the instructions from the microprocessor have been written are read out through a bus line 33 by the CPU 35, so that in response to the first instruction, (A) the initial setting of the recording bias current, recording level and recording equalization is carried out. That is, for the recording bias current, a parallel binary initial data 3F(H) is outputted by a peripheral interface adaptor 13 (hereinafter referred to as "PIA 13") through its port output $P_D$. The data 3F(H) is applied to a digital-to-analog converter (hereinafter referred to as "a D/A converter") 30, where it is converted into a corresponding DC level signal. The DC level signal is applied through a buffer amplifier 31 to an impedance control circuit 39 to control the latter, so as to control the value of the bias current, to a recording head 4, provided by a bias oscillator 32 which oscillates, for instance, at 100 KHz. In this case, the recording bias current scarcely flows as indicated by a bias current characteristic (b) in FIG. 4. The parallel binary data outputted through the port output $P_D$ are expresed digitally in 64 steps from 3F(H) to 00(H), where 3F(H) corresponds to a binary number (111111) and 00(H) corresponds to a binary number (000000). In this connection, (H) means that data is expressed in hexadecimal notation. This is also applicable to output data from ports $P_B$ and $P_C$ described later.

As a result of the recording level initial setting, a suitable binary data is outputted through the port output $P_B$, and it is converted into a DC level signal by a D/A converter 24. The DC level signal is applied through a buffer amplifier 23 to a voltage controlled amplifier (hereinafter referred to as "a VCA") 22 to control the latter, so as to set a recording amplification gain to a suitable value.

Similarly, as a result of the recording equalization initial setting, a suitable binary data is outputted through the port $P_C$ of the PIA 13, and it is converted into a DC level signal by a D/A converter 28. The DC level signal is applied through a buffer amplifier 27 to a variable capacitance circuit 26 to control the latter, so that the capacitance value of the circuit 26 is set to a suitable value. Thus, a recording equalizer control circuit 25 is set to have a suitable recording equalization characteristic attributing to the value of a coil L and the value of a variable capacitance C.

Next, the CPU carries out an instruction (B). As a result, a drive mechanism (not shown) becomes operable, so that reels 1 and 2 are rotated, and a tape 12 runs along a reproducing head 3. Then, a reference signal (for instance, 333 Hz) 16 selection instruction is outputted by a port $P_5$ of the PIA 13, to control a switch circuit 19 so as to deliver the 333 Hz reference signal. In addition, a control instruction for turning on a switch circuit 6b is outputted by a port $P_2$ of the PIA 13.

Then, the CPU 35 carries out an instruction (c) in Flow Chart 1. Under the condition that the initial data 3F(H) has been outputted through the port $P_D$ of the PIA 13, the 333 Hz reference signal is recorded for a certain period of time, and is then reproduced by a reproducing head 3. The reproducing output is rectified by a rectification circuit 7 into a DC level signal, the slight level variation of which is absorbed by a hold circuit 8. The output of the hold circuit 8 is applied to one input terminal of a comparator 10. The comparator 10 and a D/A converter 11 form a part of a sequential comparison type analog-to-digital converter (hereinafter referred to as "an A/D converter"). When the output level of the hold circuit 8 coincides with the output level of D/A converter 11, the state of the output of the comparator 10 is inverted. The inversion output of the comparator 10 is applied to a port input $P_1$ of the PIA 13. In this case, a binary data from a port output $P_A$ of the PIA 13 resultantly becomes the A/D conversion value of the reproducing output level of the 333 Hz reference recording and reproducing signal. The binary data is immediately stored in a 8700(H) address in the RAM 36. It is apparent that the DC level signal of the hold circuit 8 can be directly subjected to A/D conversion so as to be applied to the port of the PIA 13.

Instantaneously when the above-described operation is accomplished, a reset signal is outputted through a port output $P_3$ of the PIA 13, and it is applied to a reset circuit 9 to reset the output of the hold circuit 8. Next, a binary data 3E(H) obtained by subtracting one (1) from the data 3F(H) is outputted from the port output $P_D$. As a result, the impedance control circuit 39 is controlled and the recording bias current is increased. Accordingly, the 333 Hz reproducing signal is also increased and the A/D conversion data of the corresponding port output $P_A$ is stored in an 8701(H) address.

As described above, whenever the binary data from the port output $P_D$ is increased by one, the 333 Hz reproducing signal is converted into a digital data, the storing address number is increased one by one, and the data from the port output $P_A$ is stored in the respective address in the RAM 36.

In this embodiment, the binary data from the port output $P_D$ is increased one by one, however, various methods can be employed. For instance, the binary data may be decreased one by one from the maximum value thereof, or the binary data reaches the central value while fluctuating between the maximum and minimum values.

In this embodiment, when the data are stored in up to the 873F(H) address, i.e. when the data obtained by dividing the bias current into 64 parts from the maximum to the minimum have been stored, the CPU 35 carries out the next instruction (D) in Flow Chart 1.

That is, the data are read out of the addresses from 8700 (H) to 873F(H), so that the highest of the data or a value around it is obtained by operation. Thus, the binary data of the port output $P_D$ corresponding to that address is allowed to standby in a separate register.

However, when drop-out or extreme level lowering is detected as a result of the operation, then an instruction is issued so that, instead of storing the binary data in the register, the operation is carried out all over again because of mis-data, or the binary data is processed as mis-data.

Subsequently, an instruction (E) in Flow Chart 1 is carried out. The object of this operation is to obtain an average data by repeatedly carrying out the instructions (C) and (D) three times. If the number of times of repetition is increased, the accuracy of the data is increased; however, it should be set to a suitable value by taking the search time into consideration.

Thereafter, the CPU 35 carries out an instruction (F) in Flow Chart 1. Three binary data of the port output $P_D$ which have been allowed to standby in the respective registers have been obtained. The three binary data are subjected to additive average operation, to thereby obtain the average value thereof. The average value data is stored, as the optimum bias current setting data, in the register. Thus, the following adjustment is fixed to the optimum recording bias current.

The setting of the recording bias current has been accomplished as described above. Now, the CPU 35 executes an instruction (G) in Flow Chart 1. As indicated by a recording level variable characteristic in FIG. 5, first recording and reproducing are effected under the condition that a data 00(H) is provided at the port output $P_B$ of the PIA 13 to control the VCA 22 to thereby maintain the recording level of the 333 Hz signal minimum. The reproducing output is subjected to DC conversion, and the resultant output is applied to the comparator 10. On the other hand, a binary data corresponding to the reference level is provided at the port output $P_A$ and is then subjected to D/A conversion. The resultant output is applied to the other input terminal of the comparator 10. The two data are subjected to comparison in the comparator 10, to discriminate whether or not a coincidence data is applied to the port input $P_1$. If no coincidence data is obtained at the port input $P_1$, then the data of the port output $P_B$ is increased by one (1) to increase the recording level in the VCA. Thus, the reference level and the recording/reproducing output are subjected to comparison in the comparator 10 again to determine whether or not a coincidence output is obtained. As described above, the port output $P_B$ is increased one by one at a time at predetermined time intervals and the comparison is carried out until a coincidence output is obtained. When the coincidence output is obtained at the point X in FIG. 5, then the port $P_B$ output data is stored in the register. This is the execution of an instruction (I) in Flow Chart 1. In this case also, instead of a method in which the data is increased from 00(H), vaious methods, such as a method in which the data is decreased from 3F(H), may be employed.

In the next execution instruction (J), recording level search is repeatedly carried out three times, and every time a coincidence data is obtained, it is stored in the register. In this case also, it is apparent that as the number of times of search is increased, a better result is obtained.

In the next execution instruction (K) from the level setting data stored in the three registers the final recording level setting data is determined by additive average. This data is stored in the register, and it is fixed as the output data of the port output $P_B$ for the next recording equalization adjustment.

With the subsequent instruction (L), a 333 Hz release signal is outputted through a port output $P_5$, to turn off the switch circuit 19, while a high frequency reference signal (for instance, 10 KHz) selecting signal is outputted through a port output $P_6$ to turn on the switch circuit 18. On the other hand, the binary data 00(H) is outputted from the port output $P_c$ and subjected to D/A conversion, to control the variable capacitance circuit whose capacitance is varied by a DC control signal. An example of the variable capacitance circuit is a circuit system utilizing the gain adjustment of an electronic variable capacitance circuit, such as a mirror integration circuit. In this embodiment, when the data is 00(H), the equivalent capacitance of the variable capacitance circuit is small; however, as the data is increased, the equivalent capacitance is increased. The operating characteristic is set so that the peaking resonance frequency becomes much higher than 10 KHz when the capacitance is small, and the resonance frequency approaches to 10 KHz as the capacitance is increased. In this case also, the search is carried out similarly to the case of the recording level setting. More specifically, the binary data of the port output $P_c$ is increased one by one, and every time of the increment the 10 KHz recording/reproducing output and the reference level are subjected to comparison in the comparator 10 until the coincidence output is provided at the port input $P_1$. When the CPU 35 executes an instruction (M) and the coincidence output is obtained, then the CPU 35 executes an instruction (N), and the binary data of the port output $P_D$ is stored in the register. Similarly to the case of the previous instruction (E) or (J), the CPU 35 executes an instruction (O) in the program, and the data of the port output $P_C$ stored in the three registers are subjected to additive average, and thus the optimum recording equalization data is obtained.

Similar to the recording bias and recording level adjustment, the recording equalizer characteristic adjustment is divided into sixty-four so as to be variable. However, the accuracy will be improved by increasing the number of division.

When the recording bias current, recording level and recording equalization characteristic are set as described above, then an instruction (Q) is inputted into the CPU 35. As a result, the running of the tape is stopped, a 10 KHz signal reset control signal is outputted from the port output $P_6$, and an "off" signal is provided at the port output $P_2$ to turn off the switch circuit 6b. When the operator depresses the tape key 101, the digit key "1" of the selection key assembly 102 having the digit keys "1" through "9", and the memory key 103 in FIG. 1, then all of the data for the recording bias current, recording level and recording equalization of the magnetic tape used this time are stored in the appropriate addresses in the RAM 36. Once stored, all of the data can be called by depressing the keys at any time. A manual switch 104 (FIG. 1) is operated in association with a switch SW1 (FIG. 3), to freely select resistors R1 through R3, so that when it is necessary to change the frequency characteristic of the high frequency band to some extent, the frequency characteristic can be varied by changing the quality factor Q of the peaking characteristic.

A switch circuit 37 is turned on and off by mechanically detecting whether or not the cassette half has the pawl. In order to allow the operator to adjust the recording equalization characteristic, a switch circuit 29 operated in association with an external operating switch is provided. In this case, the adjustment can be achieved by varying the resistance fo a variable resistor VR.

A recording operation is started by depressing an ordinary recording button. A control signal adapted to set a reproducing output pickup terminal 14 is provided from the port output $P_7$ to turn on the switch circuit 6a. An output signal from the port output $P_4$ turns on a switch circuit 20 adapted to connect an audio input terminal 15, and simultaneously to trip the armature of a switch circuit 40 to the opposite contact (on the right-handed side in FIG. 3), so that tone quality can be varied by operating the switch SW1 of a tone quanlity switching circuit 38.

Now, a second embodiment of the device according to the invention will be described with reference to FIGS. 7 through 19.

Figure 2:
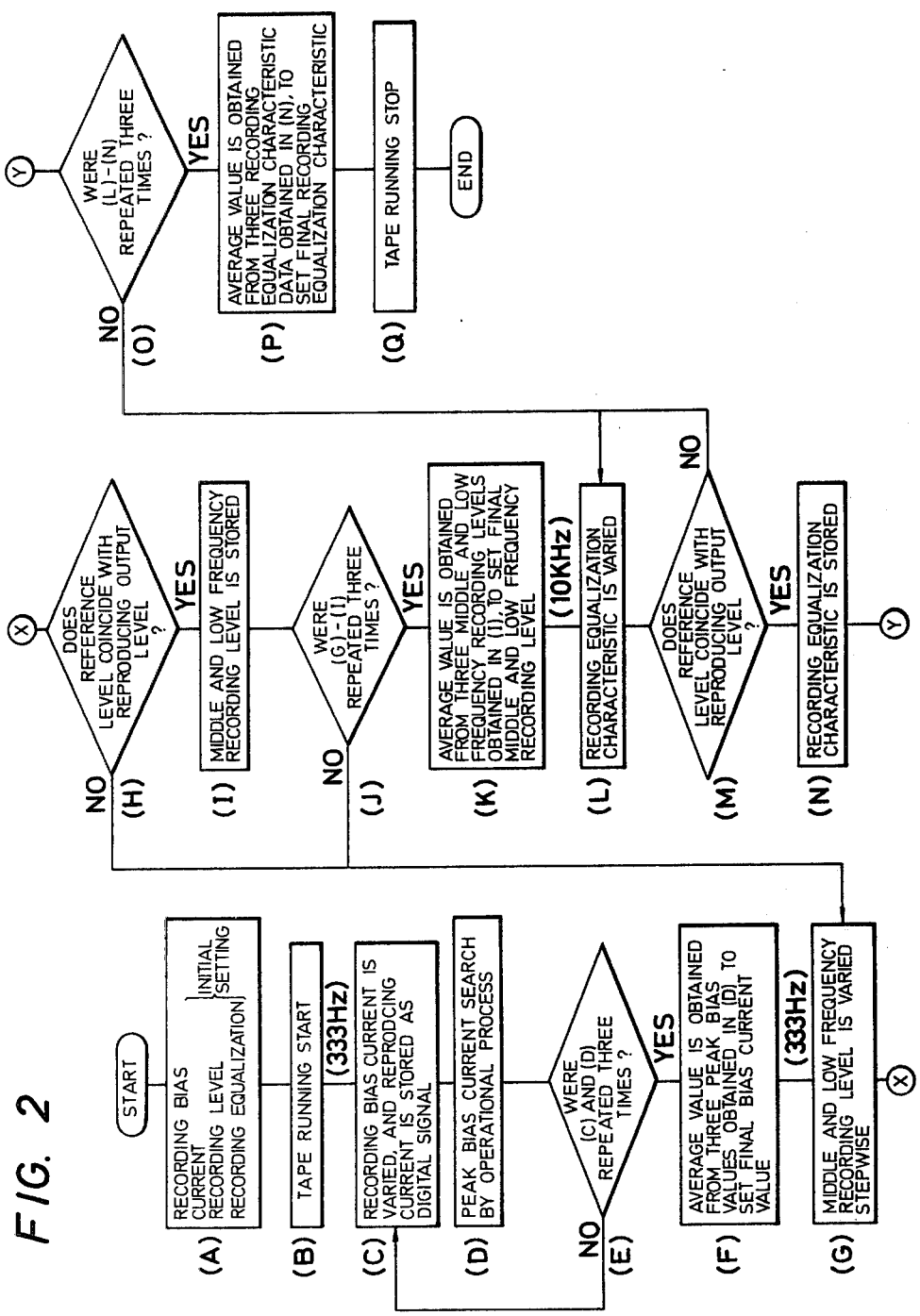
FIG. 2 is a flow chart showing the flow of operations of first embodiment of the invention.

FIG. 2 is a schematic block diagram showing the second embodiment. Either a recording level adjusting signal $f_L$ (400 Hz) or a recording equalization (EQ) adjusting signal $f_H$ (10 KHz) is selected by a change-over switch 41 so as to be applied to a line switch 42a. The line switch 42a selects one of the signal $f_L$ (or $f_H$) and the line input signal, and the signal thus selected is applied to a flat amplifier 43, where it is amplified. The signal thus amplified is applied to a recording level setting circuit 44, where its level is varied to a suitable value. Thereafter, the signal is applied to a recording equalization setting circuit 45, in which the equalization characteristic is varied. The output of the recording equalizer setting circuit 45 is superposed on a recording bias signal $f_B$ (100 KHz), and the resultant signal is recorded in a tape 47 by means of a recording head 46.

The recording bias signal $f_B$ is applied to a recording bias setting circuit 48 which operates to set a bias level to a suitable value by varying the bias level. The output of the circuit 48 is applied through a bias amplifier 49 to the recording equalization setting circuit 45, so as to be superposed on the aforementioned recording signal.

The tape recording signal is reproduced as an electrical signal by a reproducing head 50. The electrical signal is amplified by a reproducing equalizer circuit 51 and a flat amplifier 52, and is then applied through a switch 53 to a line amplifier 54. The output of the line amplifier 54 is provided as a line output through a line switch 42.

The output of the flat amplifier 52 is converted into a DC level signal by a detection circuit 55, and the DC level signal is applied to one input terminal of a comparator 56, to the other input terminal of which a reference signal, i.e. the output of a D/A converter 57, is applied. The D/A converter 57 operates to convert a parallel binary digital signal outputted by a port output $P_A$ of a PIA 58 into a DC level signal. The output of the comparator 56 is applied to a port output $P_1$ of the PIA 58.

A binary digital signal is outputted through a port output $P_B$ of the PIA 58, and it is decoded by a decoder 59. Thereafter, the binary digital signal thus decoded is converted into control signals 201, 202 and 203 for controlling the recording level setting circuit 44, the EQ setting circuit 45 and the recording bias setting circuit 48.

The change-over switch 41 and the line switches 42a and 42b are turned on and off by the port outputs $P_2$ and $P_3$ of the PIA 58. The port output $P_4$ of the PIA 58 is a control signal for controlling the mechanism system and the amplifier system (electrical system) of the tape recorder. Predetermined control signals including a signal which indicates whether or not the setting of automatic recording (effected during the operator's absence) is made are applied to the port input $P_5$ from the mechanism system and the amplifier system.

Furthermore, a CPU 60, and a ROM 61a and RAM 60 in which programs for controlling the CPU 60 have been stored are provided. A keyboard 62 for providing external instructions is connected to an input/output port $P_C$ of the PIA 58.

Current is applied to the RAM 61 from the power source during the normal operation. However, when the power supply is interrupted, current is supplied to the RAM 61 from a back-up power source, such as batteries, so that the contents stored therein are maintained at all times.

Immediately after the power switch is turned on, the device is set to the standard state if it is not in the automatic recording state. Accordingly, immediately after the power switch is turned on, recording can be carried out in the standard state similar to ordinary tape recorders.

Figure 17:
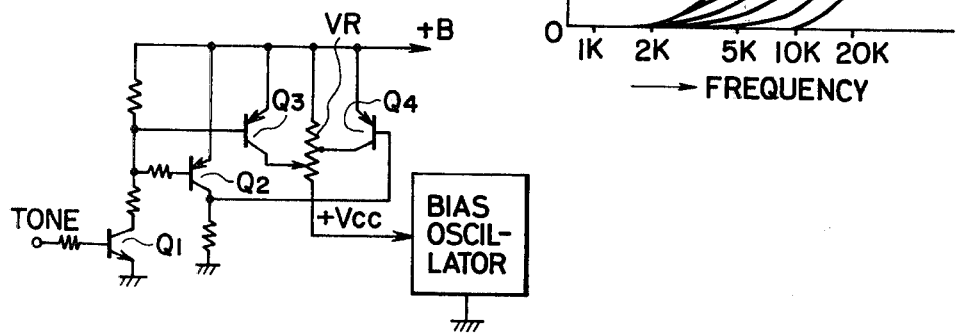
FIG. 17 shows one example of a recording bias manual control circuit.

When the device is in the standard state, a tone signal is outputted through a port output $P_4$ of the PIA 58, so that, only in this case, bias adjustment, level adjustment and EQ adjustment can be carried out manually. Accordingly, the adjustments can be effected as desired by the operator. In the automatic adjustment, no tone signal is outputted, and accordingly the manual adjustment is cancelled irrespective of the manual adjustment position. FIG. 17 shows a bias manual adjustment circuit. In FIG. 17, when the tone signal is raised to "H" (logical high level), then transistors $Q_1$, $Q_2$ and $Q_3$ are rendered conductive (on), and a transistor $Q_4$ is rendered non-conductive (off). As a result, the resistance of a variable resistor VR becomes variable and the output of a bias oscillator is changed. When the tone signal is set to "L" (logical low level), then the transistors $Q_1$, $Q_2$ and $Q_3$ are rendered non-conductive while the transistor $Q_4$ is rendered conductive, as a result of which the resistance of the variable resistor VR is set to the mid value thereof, i.e. the constant value, and accordingly the bias oscillation output is constant.

In accordance with FIGS. 8(A) through 8(K), the operation of the device thus constituted will be described with reference to operating waveforms shown in FIGS. 9 through 11 when necessary.

The chart shown in FIG. 8(A) shows an example of the case where the tape recorder has an automatic recording function. In this case, it is automatically determined whether or not the device is set to the automatic recording state. As soon as the power switch is turned on, a control signal indicating whether or not the setting of automatic recording has been done is applied to the input port $P_5$ of the PIA 58. Deciding the control signal, the CPU 60 issues instruction signals so that the device is set to the recording characteristics which was set before the power switch was turned on, if the setting of the automatic recording has been done. In other words, the operator reads data out of the memory circuit 61 to set the tape recorder in setting the automatic recording so that the recording bias, recording level and EQ characteristics have values corresponding to a tape to be used, respectively. Accordingly, when the power switch is turned off, the characteristic values are stored in the memory 61. Therefore, when the CPU 60 discriminates the fact that the automatic recording has been set, the recording level, recording bias and EQ characteristic are set for the aforementioned characteristic values by the setting circuits 44, 45 and 48, respectively.

If the tape recorder is not set for the automatic recording, then the control signals 201, 202 and 203 are outputted so that the recording level, recording bias and EQ characteristics of, for instance, a standard tape. Thus, the device is ready for key inputs.

FIG. 8(B) is a chart for carrying out the setting of the device in the case where the "AUTO" switch is depressed to start the recording characteristic automatic adjustment. After it is discriminated whether the device is in stop state or is in pause state, the device is set for "record/play" state. Simultaneously, the operation of the recording bias manual adjustment circuit is inhibited, and the line input switches $S_{2a}$ and $S_{2b}$ are operated as required. Furthermore, setting is effected so that stoppage of the tape is inhibited with the tape counter reset ("0"). The kind of the tape set by the operator is discriminated, and the setting circuits are set for the recording level, recording bias and EQ characteristics of the tape. The invention will be described with reference to the case where the standard tape is employed, and the "BIAS", "LEVEL" and "EQ" lamps on the keyboard are turned off.

FIG. 8(C) is a chart for automatically detecting a magnetic tape. The minimum value 00(H) of the digital signal is provided at the output port $P_A$ of the PIA 58. After being converted into an analog signal corresponding to 00(H) by the D/A converter 57, the minimum value becomes a reference input to the comparator 56. In response to the port output $P_2$ of the PIA 58, the switch 41 selects $f_L = 400$ Hz as the recording signal.

As the reproducing output is zero in the leader tape portion, the output of the detector 55 is zero volt. Accordingly, the output of the comparator 56 is at low level. As soon as the magnetic tape portion comes, the reproducing level is increased, and the output of the comparator is inverted to the high level. With the aid of the high level signal ($P_1$), the tape detection is carried out, and the incorporated tape counter is reset for "n". The state described above is indicated in the period C in FIG. 9.

FIG. 8(D) is a chart for carrying out recording level coarse adjustment for the optimum recording bias setting. This adjustment is carried out under the condition that the bias and recording equalizer are in the standard state. With respect to the bias current versus reproducing level characteristic of the standard tape as shown in FIG. 10(A), for tapes 301, 302 and 303 different in sensitivity the digital conversion possible range must be increased in order that the reproducing level is allowed to fall in the digital conversion possible range; while in order to accurately detect the reproducing level maximum value of the bias current characteristic, the resolution power of the digital conversion section must be of the order of 0.1 dB. Accordingly, the level adjustment is set to the point A in FIG. 10(B) by the coarse level adjustment, and therefore the digital conversion possible range can be decreased with the resolution power as 0.1 dB.

The level to be subjected to coarse adjustment is not the central value 20(H). This is due to the fact that the bias curves pass through the point A in FIG. 10(B), and thus the range higher in level is increased. A digital level indicating the standard level 0A(001010) is provided at the output port $P_A$, and an analog level corresponding to the value 0A is employed as the reference input to the comparator 56. In this case, the "BIAS" lamp is turned to flicker (on and off). Furthermore, the control input signal 201 of the recording level setting circuit 44 is suitably changed to select a recording level value which is equal to the reference input of the comparator 56. In the second embodiment of the device according to the invention, a binary search method is employed as indicated in the period D of FIG. 9. That is, the reproducing level and the reference level are subjected to comparison, and according to the magnitude thereof the level is subjected to addition and subtraction as $\frac{1}{2}$, $\frac{1}{4}$, $\frac{1}{8}$, ... and 1/64, so as to detect the recording level at which the reproducing level is equal to the reference level. In this connection, it is apparent that instead of the binary search method, other methods may be employed. When the reproducing level is increased to a level corresponding to the upper limit value 3F which can be digitally processed thereafter, all of the indication lamps are caused to flicker to indicate that the adjustment is impossible.

When the recording level corresponding to the standard reproducing level 0A has been set, recording bias setting is carried out in accordance with parts of the flow chart as shown in FIGS. 8(E) and 8(F). That is, the 6-bit digital control signal 203 is varied in 64 steps from 00(H) to 3F, and the reproducing levels corresponding to those are converted into 6-bit digital signals, which are stored in the memory. When the reproducing operation has been accomplished, the optimum recording bias is detected and set by the utilization of the memory contents. In other words, a so-called "level sweep method" is carried out. The reproducing levels are digitalized by so-called "sequential comparison type A/D conversion" employing the comparator 56 and the D/A converter 57. The reproducing levels are converted into values from 00(H) to 3F in hexadecimal notation, and the reproducing levels outside the range cannot be processed. That is, if the reproducing level includes the value 3F, then the error signal is produced to indicate that the adjustment is impossible. This is the case as indicated by the curve 63 or 64 in FIG. 10(B). Such a reproducing characteristic is never provided because setting the recording level has been accomplished in accordance with the flow chart (D) in advance. However, if the operator erroneously uses a tape with the optimum use position (for instance in the case where a tape to be used with the chromium position is used with the L.H. tape position), then the curve 63 or 64 appears.

In reading the reproducing level with respect to each bias current, since there is a time lag $t_1$ from the recording head to the reproducing head, i.e. $t_1 =$ (the distance between the recording head and the reproducing head)/(tape speed), the bias is set to $B_1$ at the time instant $t=0$ as indicated in FIG. 10(C), in the time lag $t_1$ the reproducing level is subjected to A/D conversion and is then written into the RAM; then the bias is set to $B_2$, and so forth. Accordingly, for instance with $t_1 = 100$ msec, more than $6.4 \sec = 64 \times 100 \times 10^{-3}$ is always necessary. Therefore, if writing the reproducing level is effected in accordance with the system in which the bias is increased at certain intervals and the data are written in every time lag $t_1$, then the time can be reduced.

FIG. 10(D) shows the case where the bias is increased every period of time $t_0 = t_1/2$. The bias is set to $B_1$, in $t_0$ second the bias is set to $B_2$, in another $t_0$ second the bias is set to $B_3$, and so forth. Simultaneously, the reproducing level is subjected to A/D conversion, and the resultant data is written, as the reproducing level for the bias $B_1$, into the RAM. This operation is similarly carried out. As a result, writing the data can be accomplished in 3.3 seconds $= t_0 \times 64 + t_1$, and the time is shortened. In the above-described case, $t_0 = t_1/2$; however, it is apparent that the time can be further reduced by decreasing $t_0$.

If writing of the reproducing level is started by detecting the provision of the reproducing output for the bias $B_1$ (or the cue signal), then $t_1$ is limitless, and accordingly even a different time recording and reproducing type tape deck (two-head mechanism) can be used.

The sixty-four (64) reproducing data stored in the memory are subjected to decision and operation in the CPU 60. More specifically, the number of the signals having the reproducing level maximum value M is decided, and if it is at least three (n, in general), then the minimum value $B_1$ of the recording bias corresponding thereto (actually, being a digital signal indicating the control signal 203 corresponding thereto) is first stored. However, in the case where reproducing level characteristics as shown in FIGS. 10(E) and 10(F) are obtained, the maximum values are read as (M-1) and (M-2), respectively, so that the adjustment can be accomplished in the case of FIGS. 10(E) and 10(F), and erroneous operations due to drop-out and extreme level variation are prevented. If, when the maximum value M is successively decreased as (M-1), (M-2) and so on, the number of signal is not more than three (n), it is determined that the adjustment is impossible, and the error signal is produced.

The bias $B_2$ is similarly obtained by repeating the above-described operation. Then, the average value $B = (B_1 + B_2)/2$ of the two biases is calculated. Thereafter, the optimum bias value $B' = B + N$ is obtained, where N is the predetermined value. Correction is made by addition of the value N so that the calculation of the average value may not provide a low bias value.

Figure 9:
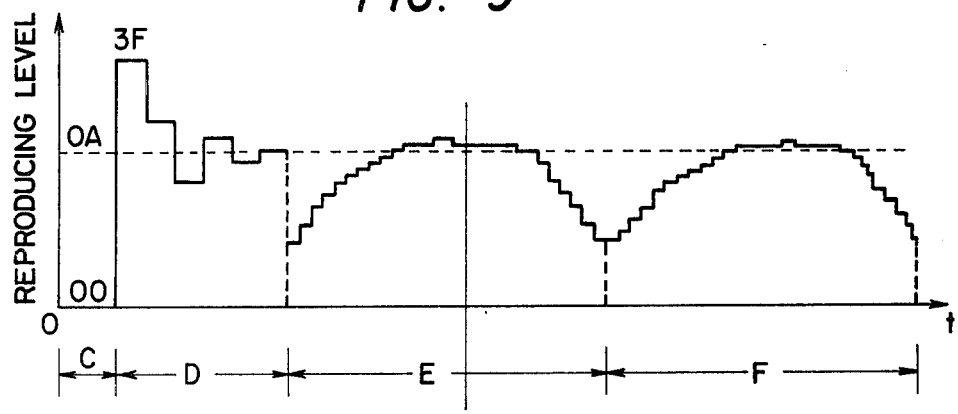

The reproducing levels in the sweep of recording bias adjustment as described above are indicated in the periods E and F in FIG. 9.

A digital signal which becomes the control signal 203 corresponding to the optimum recording bias B' thus obtained is stored in a predetermined address in the memory, whereby the recording bias setting circuit 48 is controlled and locked. At this time, the flickering state of the "BIAS" lamp is eliminated and the "BIAS" lamp is maintained lit on.

FIGS. 8(G) and 8(H) show parts of the flow chart for recording level adjustment. The reference input of the comparator 56 is set to a reference level corresponding to 20(H), and the coarse adjustment of recording level is carried out in accordance with the binary search method which is indicated in the period G of FIG. 11(A). In this case, the "off" state of the "LEVEL" lamp is changed to the flickering state. In this case also, if the reproducing level is outside the digital process range, then the error signal is produced.

Figure 11A:
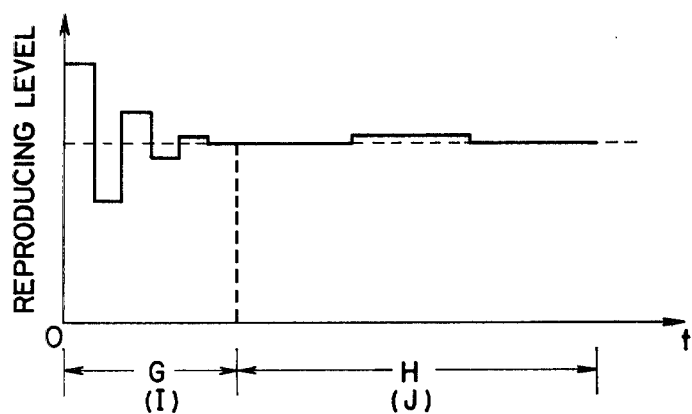
Figure 11B:
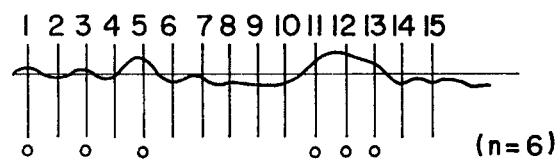

After the level coarse adjustment, the fine adjustment is carried out. In this case, as shown in FIG. 11(B), the comparison output of the comparator 56 is sampled at predetermined time intervals, for instance, fifteen times, so as to count how many times (n) the output is set to the high level or the reproducing level becomes high. If the count result meets, for instance, $8 < n < 12$, then the recording level is employed as the optimum recording level. If $n < 8$ or $n > 12$, then the recording level is increased or decreased by one step, and comparison and counting are carried out again. For the fine adjustment, the above-described operation is repeatedly carried out, for instance, four times until the condition $8 < n < 12$ is satisfied.

If the digital signal indicating the control signal 201 for providing the recording level thus obtained is 3F or 00(H), then the error signal is produced to indicate the fact that the adjustment is impossible. When the level setting and the storage are accomplished, the state of the "LEVEL" lamp is changed; that is, the "LEVEL" lamp is maintained lit on. The waveform concerning the above-described operation is shown in FIG. 11(A).

FIGS. 8(I) and 8(J) show the flow chart for EQ characteristic adjustment. First, the recording signal is switched from $f_L = 400$ Hz to $f_H = 10$ KHz. In this case, the "off" state of the "EQ" lamp is changed to the flickering state. Thereafter, the EQ setting circuit 45 is controlled by the control signal 202, and operation is carried out in a procedure similar to that in the above-described recording level adjustment, as indicated in FIG. 11(A).

Only the different operations will be described. If, in the step of fine adjustment, the digital signal for the control signal indicating the EQ characteristic is 00(H), then the error signal is produced; and if it is 3F, then the bias is too deep, and accordingly the bias is decreased by one step, so that the recording level adjustment and EQ adjustment, i.e. the adjustment of recording compensation value is carried out again. If, in this case, the above-described decision loop is effected four times, then the error signal is produced to indicate the fact that the adjustment is impossible. When the optimum EQ characteristic is thus obtained, set and stored, the state of the "EQ" lamp is changed to the steady "on" state. Thus, the adjustment has been accomplished.

FIG. 8(K) shows a part of the flow chart for restoring the device to the stop state. As indicated in the figure, the tape is stopped with the value "0" of the counter. This means that, since the counter is reset with a positive integer "n" at the start of operation, the tape overruns for a distance corresponding to the count value n. This is to erase the signal ($f_L$, $f_H$) which has been recorded at the time of automatic adjustment.

According to the invention, the memories, CPU and PIA can be constituted by microprocessors, such as microcomputers. Therefore, a magnetic recording and reproducing device small in size and high in reliability can be obtained. In addition, the operations of, for instance, the counter, timer, etc. and the other operations can be controlled merely by increasing the programs. Furthermore, the invention is advantageous in that the optimum recording characteristics are obtained for all kinds of tapes.

Figure 12A:
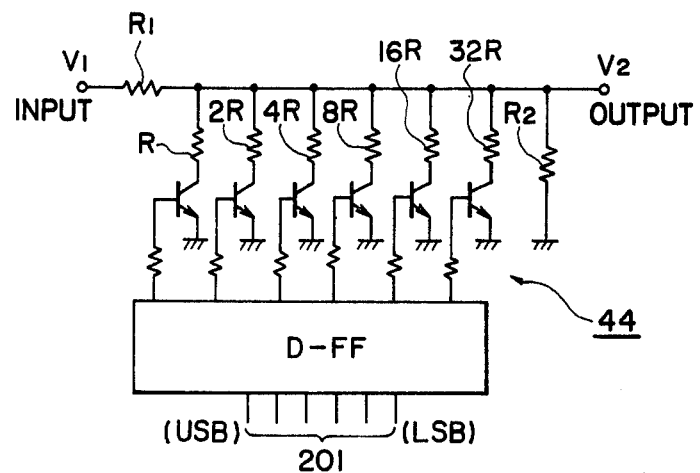
FIG. 12(A) is a diagram showing one example of a recording level setting circuit.
Figure 12B:
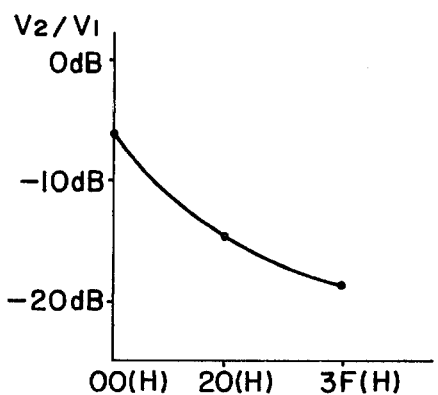
FIG. 12(B) is a characteristic diagram thereof.

FIG. 12(A) shows one specific example of the recording level setting circuit 44. In the example, the impedance between the input/output line and the ground is varied by the 6-bit parallel digital control signals 201 from the decoder 59. For this purpose, the circuit is formed with switching transistors (Q), a resistor network (R, 2R, . . . , and 32R) and a D type flip-flop (D-FF). FIG. 12(B) indicates the input/output ratio of recording level corresponding to the control signal 101.

Figure 13A:
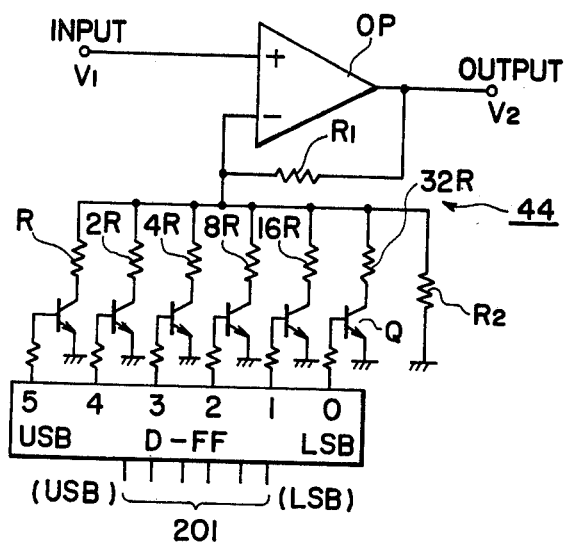
FIG. 13(A) is a diagram showing another example of the recording level setting circuit.
Figure 13B:
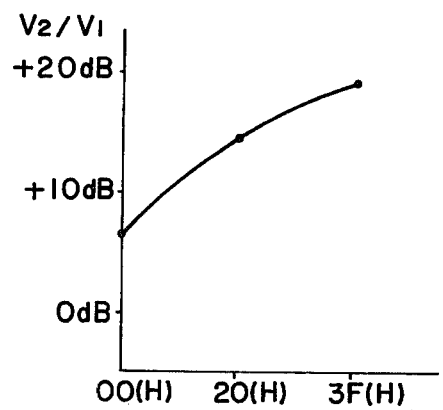
FIG. 13(B) is a characteristic diagram thereof.

FIG. 13(A) shows another example of the recording level setting circuit 44. The impedance between the inverted input terminal of an operational amplifier OP and the ground is varied by the control signal 201, to provide a characteristic curve as indicated in FIG. 13(B). The circuits shown in FIGS. 12 and 13 can be constituted in low cost. In addition, in controlling multiple channels, the characteristics can be accurately arranged. For instance, with respect to the recording level, the L and R channels can be simultaneously controlled with one control signal, thereby enabling the circuit construction simpler.

Figure 14A:
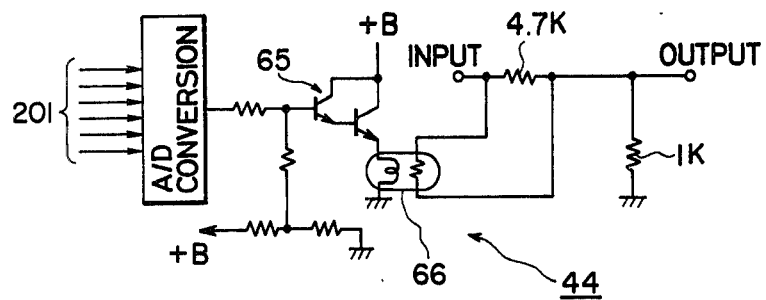
FIGS. 14(A) and 14(B) are diagrams showing other examples of the recording level setting circuit.
Figure 14B:
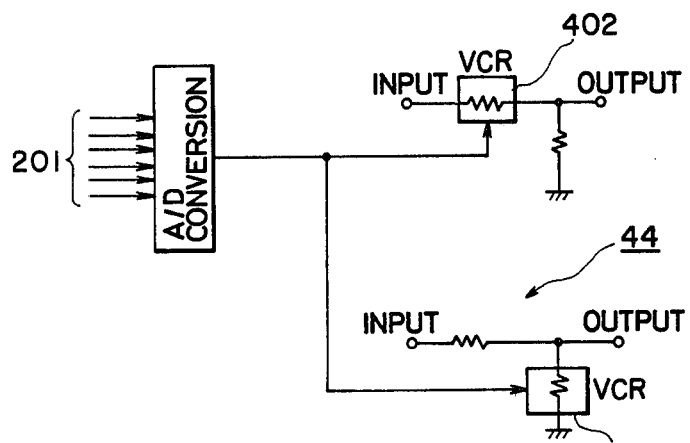
Figure 14C:
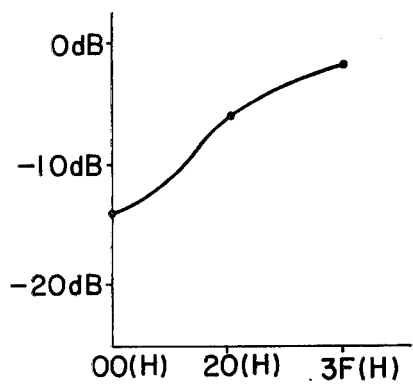
FIG. 14(C) is a characteristic diagram thereof.

Other examples of the recording level setting circuit 44 are shown in FIGS. 14(A) and 14(B). The digital control signal 201 is converted into a DC voltage by an A/D converter. In FIG. 14(A), the DC voltage is used to control a so-called "voltage controlled variable resistance element (VCR)" 66 employing a CdS photo-coupler with the aid of a drive circuit 65, to thereby vary the recording level. In FIG. 14(B), the VCR 66 (L and R channels) is directly controlled by the DC voltage. The characteristic of each of these circuits is as shown in FIG. 14(C). In the circuit shown in FIG. 14(A) or 14(B), the transmission line for control is only one provided for the DC voltage. Accordingly, the circuit is advantageous in that, in the case where the tape record should be separated from the control circuit section thereof, the number of transmission lines is reduced.

Figure 15A:
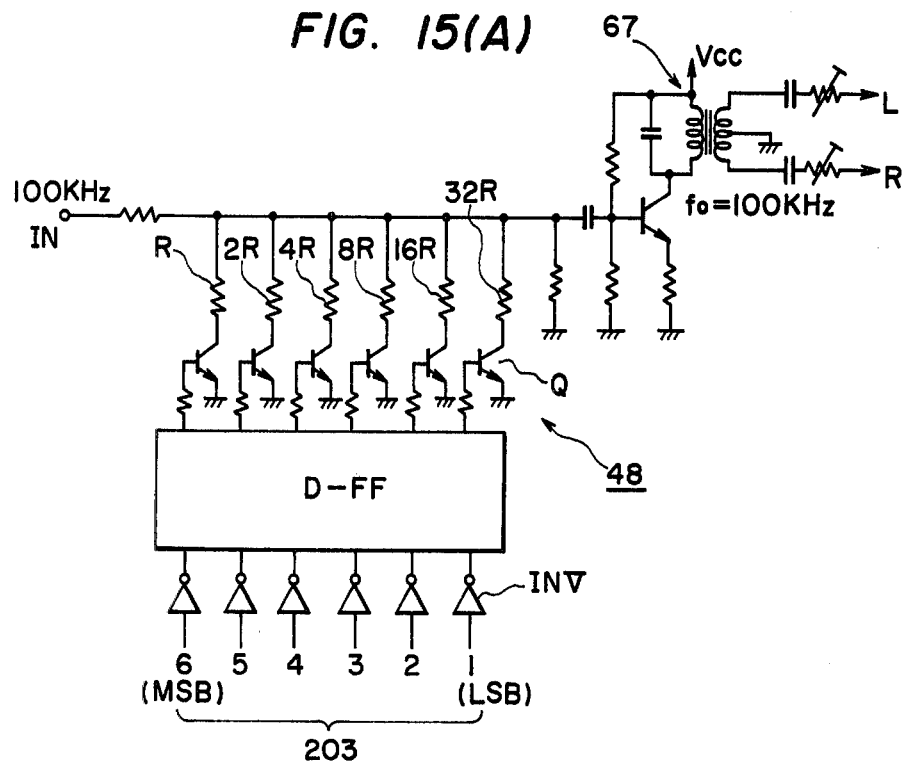
FIG. 15(A) is a diagram showing one example of a recording bias setting circuit.
Figure 15B:
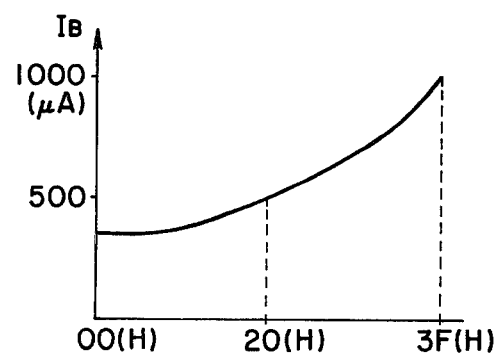
FIG. 15(B) is a characteristic diagram thereof.

One specific example of the recording bias setting circuit 48 is shown in FIG. 15(A). In this circuit, the resistance between a bias signal line and the ground is varied by the 6-bit control signal 203 from the decoder 59. The circuit includes switching transistors Q, a resistor network (R, 2R, . . . , and 32R), a D-type flip-flop D-FF, inverters INV, etc. Reference numeral 57 designates a bias amplifier for amplifying 100 KHz. FIG. 15(B) indicates the variations of the bias signal with respect to the control signal 203.

Figure 16A:
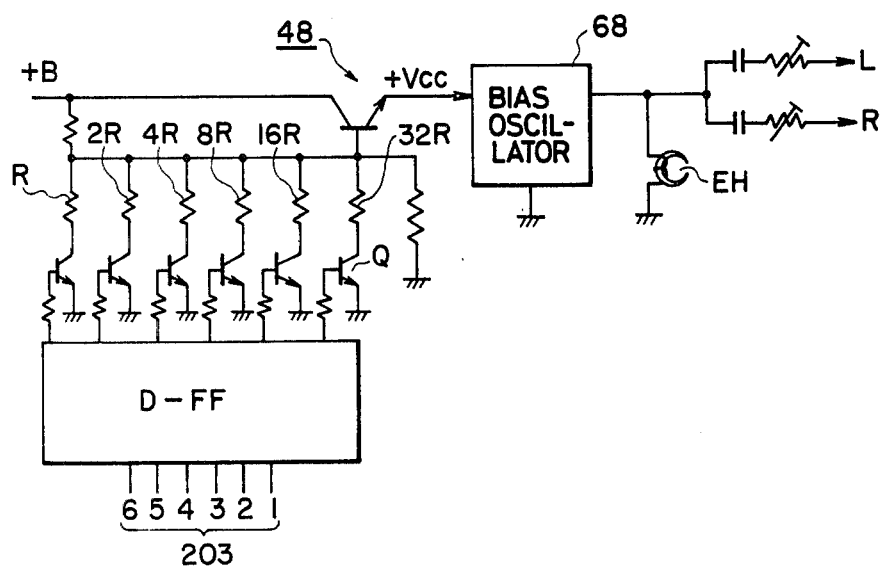
FIGS. 16(A) and 16(B) are diagrams showing other examples of the recording bias setting circuit.
Figure 16B:
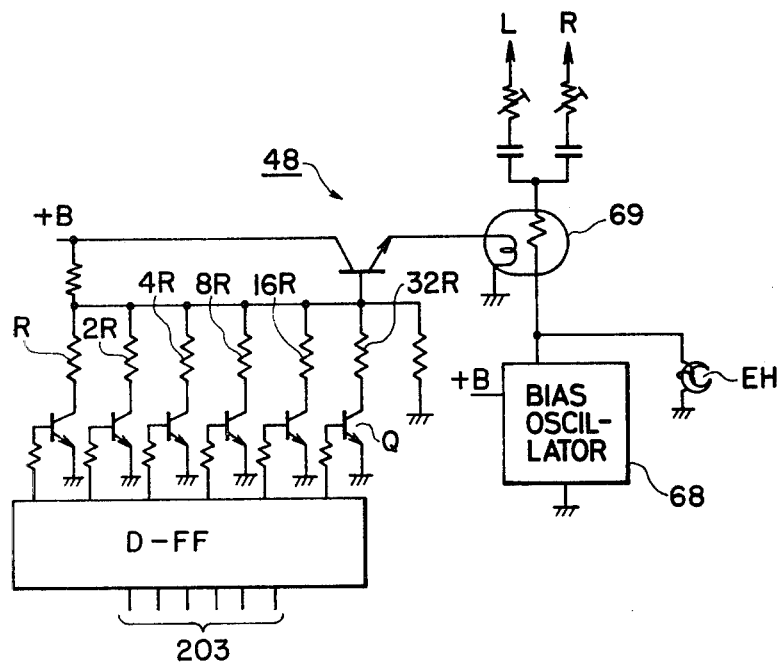

Other specific examples of the recording bias setting circuit 48 are as shown in FIGS. 16(A) and 16(B). In the circuit shown in FIG. 16(A), the digital control signal 203 is converted into a DC voltage by a D-type flip-flop D-FF, switching transistors Q, and a resistor network (R, 2R, . . . , and 32R), to vary the supply voltage Vcc of a bias oscillator 68. Reference character EH designates an erasing head. In the circuit shown in FIG. 16(B), the impedance of a photocoupler 69 adapted to vary the output level of a bias oscillator 68 is controlled by the digital control signal 203.

Figure 18A:
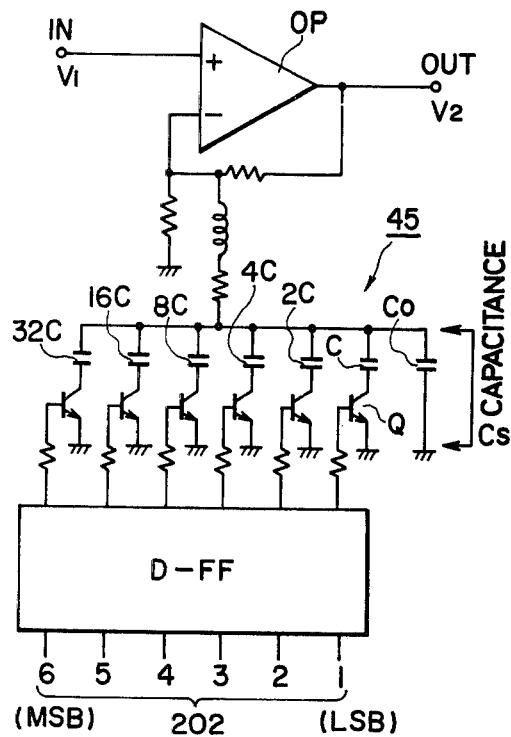
FIG. 18(A) is a diagram showing one example of a recording EQ circuit.
Figure 18B:
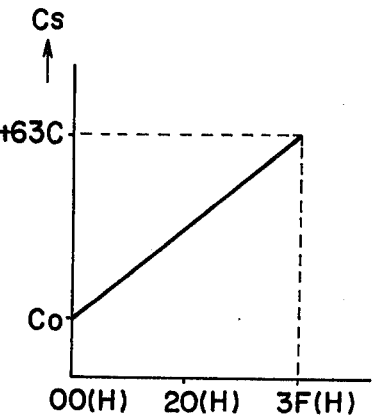
FIGS. 18(B) and 18(C) are characteristic diagrams thereof.
Figure 18C:
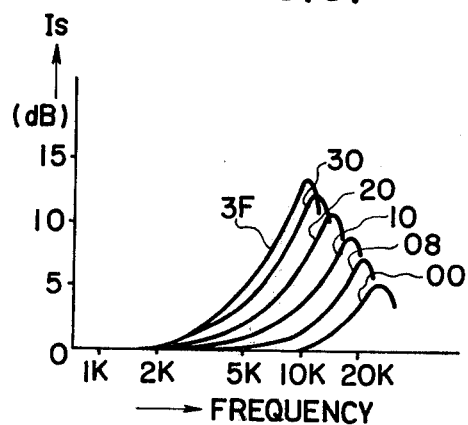

One specific example of the recording equalizer setting circuit 45 is as shown in FIG. 18(A). In the circuit, the value of a capacitance element Cs for equalizer characteristic is varied in response to the control signal 202 from the decoder 59, to thereby suitably select the amount of compensation for the 100 KHz signal. The circuit includes an operational amplifier OP, switching transistors Q, a capacitance network (C. 2C, . . . , and 32C) and a D-type flip-flop D-FF, etc. FIG. 18(B) illustrates the variations of capacitance with respect to the digital control signal 202. FIG. 18(C) shows the frequency characteristic curves of recording signal current with the digital control signal 202, i.e. the capacitance, as the parameter.

Figure 19A:
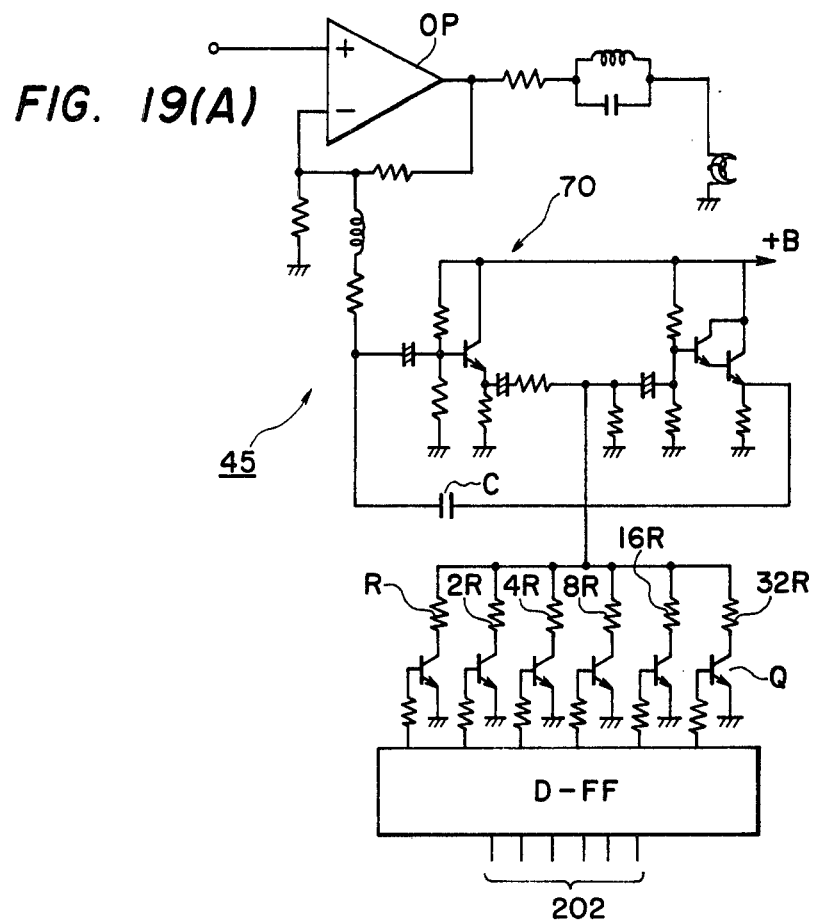
FIG. 19(A) is a diagram showing another example of the recording EQ circuit.
Figure 19B:
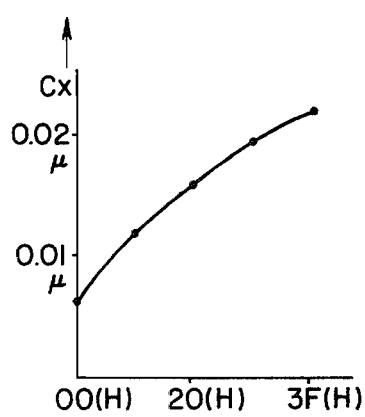
FIGS. 19(B) and 19(C) are characteristic diagrams thereof.
Figure 19C:
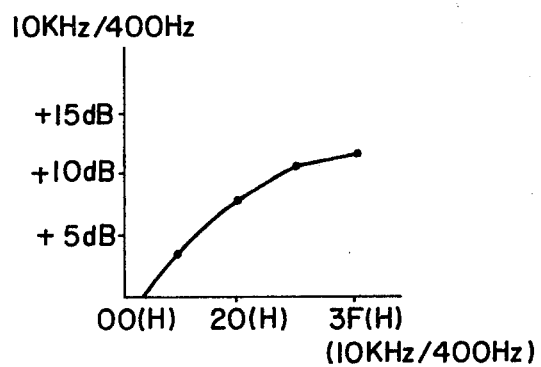

Another example of the recording equalizer setting circuit 45 is as shown in FIG. 19(A). The gain of an amplifier 70 is carried by the control signal 202, a D-type flip-flop D-FF, switching transistors Q and a resistor network (R, 2R, . . . , and 32R), to thereby control an equivalent capacitance $Cx=(1-A)C$, where A is the gain of the amplifier 70, C is the feedback capacitance of the amplifier 70, the input impedance is infinite, and the output impedance is zero. In the circuit, unlike the circuit shown in FIG. 18, instead of the precision type capacitance elements, the resistance elements are employed, and accordingly, the components can be relatively readily available. FIG. 19(B) shows the variation characteristic curve of the equivalent capacitance Cx. FIG. 19(C) shows the recording current compensation variation characteristic.

Figure 20:
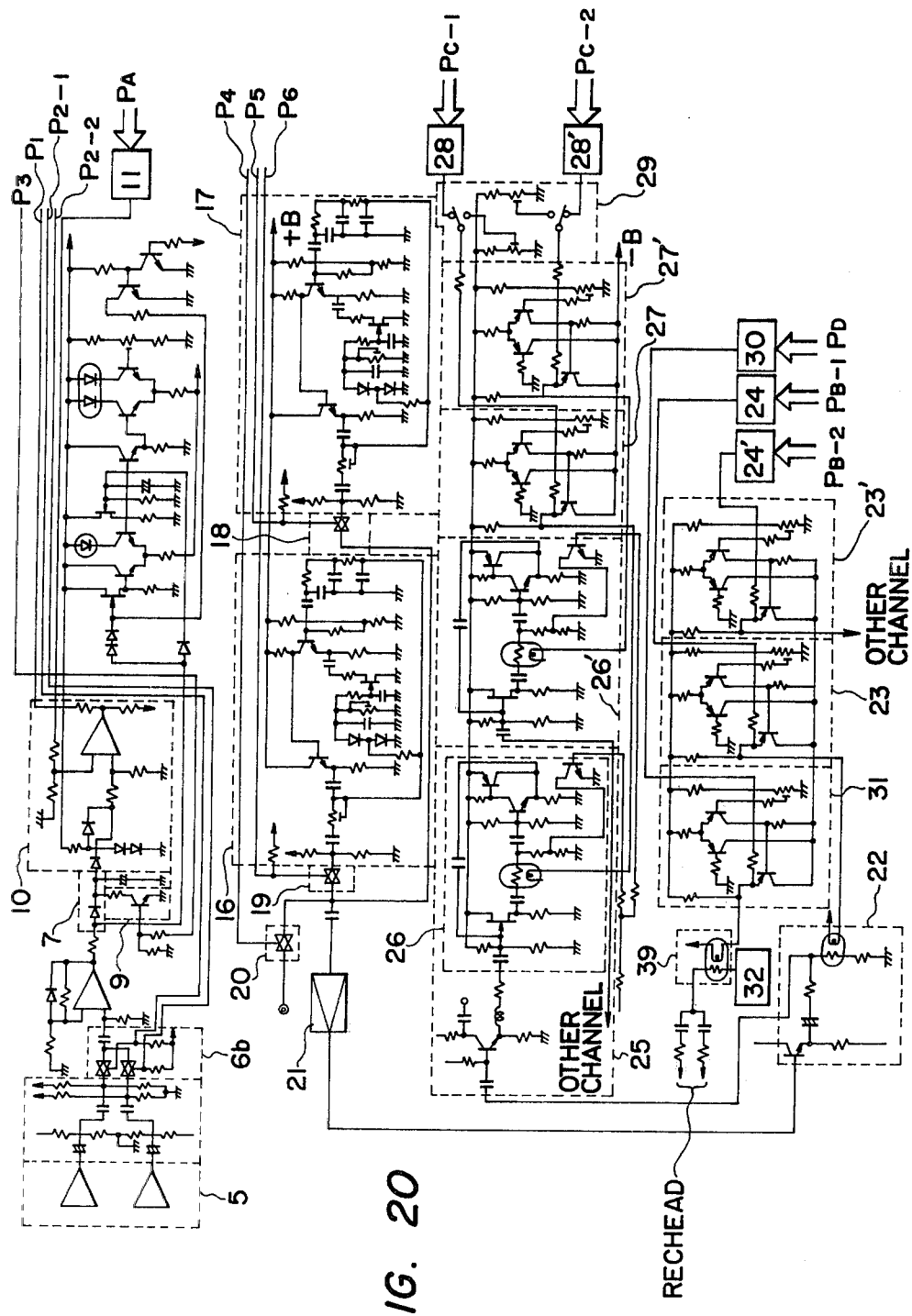
FIG. 20 is a circuit diagram showing a specific example of the block diagram shown in FIG. 3.

FIG. 20 is a part of a specific circuit diagram which has been designed for experiment with respect to the block diagram shown in FIG. 3. In the present invention, a microprocessor $\mu$-COM 43 series $\mu$-PD 546 made by Nippon Electric Co. is employed.

INDUSTRIAL USABILITY

As is apparent from the above description, the invention provides the computer control type recording bias, recording level and recording equalization automatic adjustment utilizing the microprocessor. Therefore, the adjustment can be achieved in a short time with high accuracy.

If a battery backup type complementary MOS random access memory (C-MOSRAM) or the like is employed as the memory which stores the data, then the data can be maintained unchanged even if the power service is interrupted.

The order of the automatic adjustment is such that after the recording bias is set, the recording level is set, and finally the recording equalization adjustment is carried out. Therefore, the recording bias, recording level and recording equalization can be set by only one adjustment operation, and yet the data are high in reliability.

In the adjustment of the recording bias current, drop-out or extreme level variation can be detected without fail, if caused, and therefore no erroneous operation attributing to such a phenomenon is caused.

Furthermore, the device is provided with complete automatic adjusting function and yet the device can be manually operable, so that the degree of freedom for the operator is improved.

In the invention, the processor such as a microcomputer or the like is employed. Therefore, the other operations, such as for instance the operation of the timer tape counter can be controlled merely by increasing the number of soft-ware and the relevant interface. In addition, it is possible to give multi-functions to the magnetic recording and reproducing device. Thus, a variety of effects or merits have been provided by the invention.

We claim:

1. A magnetic recording and reproducing device comprising: means for setting an optimum recording bias current, said optimum recording bias current being set by varying a recording bias current at arbitrary time intervals and digitally storing and operating reference recording/reproducing signals corresponding to the recording bias current thus varied; means for setting an optimum recording level, said optimum recording level being set by varying a recording level at arbitrary time intervals and comparing reference recording/reproducing signals corresponding to the record level thus varied with a reference level; and means for setting an optimum recording equalization characteristic, said optimum recording equalization characteristic being set by varying a recording equalization characteristic at arbitrary time intervals and comparing high frequency band reference recording/reproducing signals corresponding to the record equalization characteristic thus varied.

2. The device as claimed in claim 1 characterized in that said means for setting the optimum recording level is operated after said means for setting the optimum recording bias current is operated, and finally said means for setting the optimum recording equalizer characteristic is operated.

3. The device as claimed in claim 1 wherein said means for setting the optimum recording level comprises means for obtaining at least two optimum recording level data and subjecting said data to additive average in digital mode, to obtain a finally optimum recording level current.

4. The device as claimed in claim 1 wherein said means for setting the optimum recording equalization characteristic comprises means for obtaining at least two optimum recording equalizer characteristic data and subjecting said data to additive average in digital mode, to obtain a finally optimum recording equalization characteristic.

5. The device as claimed in claim 1 wherein said means for setting the optimum recording bias current comprises means for obtaining at least two optimum recording bias current data and subjecting said data to additive average in digital mode, to obtain a finally optimum recording bias current.

6. A magnetic recording and reproducing device comprising: means for varying a recording bias current at arbitrary time intervals; means for recording and reproducing a reference recording signal; means for storing in a register analog-to-digital converted reference recording/reproducing signals corresponding to said recording bias current; and operation means for reading out the content stored in the register and subjecting the content to comparison operation, to select an optimum recording bias current, said device being preset by storing in a register a digital signal providing said optimum recording bias current.

7. The device as claimed in claim 6 characterized in that said means for varying operates to be varied every predetermined period of time in response to an operational instruction from a microprocessor.

8. The device as claimed in claim 6 characterized in that said means for varying operates to vary said recording bias current in digital mode in response to the operational instruction from the microprocessor.

9. The device as claimed in claim 6 characterized in that said operation means comprises instruction means in which the reference recording/reproducing signals corresponding to the values of said recording bias current from the minimum value to the maximum value are subjected to analog-to-digital conversion, drop-out is detected by an operation based on the content stored in the register, and when the drop-out is detected, the operation is determined as ineffective information and returns to the initial operation or said drop-out is processed as ineffective information.

10. A magnetic recording and reproducing device comprising: means for varying a recording bias current at arbitrary time intervals; means for recording and reproducing a reference recording signal; means for storing in a register analog-to-digital converted reference recording/reproducing signals corresponding to the recording bias current; operation means for reading out the content stored in the register and subjecting the content to comparison operation, to select an optimum recording bias current; and control means for repeatedly carrying at least twice a routine that said optimum recording bias current is selected, the optimum recording bias currents obtained through the repetition of said routine being subjected to additive average to obtain a finally optimum recording bias current.

11. A magnetic recording and reproducing device comprising: means for setting an optimum recording bias current, said optimum recording bias current being set by varying a recording bias current at arbitrary time intervals and digitally storing and operating reference recording/reproducing signals corresponding to the recording bias current thus varied; means for setting an optimum recording level, said optimum recording level being set by varying a recording level at arbitrary time intervals and comparing reference recording/reproducing signals corresponding to the recording level thus varied with a reference level; means for setting an optimum recording equalization characteristic, said optimum recording equalization characteristic being set by varying a recording equalization characteristic at arbitrary time intervals and comparing high frequency band reference recording/reproducing signals corresponding to the recording equalization characteristic thus varied; and means for storing data representative of said optimum recording bias current, optimum recording level and optimum recording equalization characteristic in digital mode separately according to the kinds of magnetic tapes, said data being selectable as required.

* * * * *